(12) United States Patent
Luo et al.

(10) Patent No.: US 6,884,685 B2
(45) Date of Patent: Apr. 26, 2005

(54) RADICAL OXIDATION AND/OR NITRIDATION DURING METAL OXIDE LAYER DEPOSITION PROCESS

(75) Inventors: Tien Ying Luo, Austin, TX (US); Ricardo Garcia, Round Rock, TX (US); Hsing H. Tseng, Austin, TX (US)

(73) Assignee: Freescale Semiconductors, Inc., Austin, TX (US)

( * ) Notice: Subject to any disclaimer, the term of this patent is extended or adjusted under 35 U.S.C. 154(b) by 0 days.

(21) Appl. No.: 10/366,777

(22) Filed: Feb. 14, 2003

(65) Prior Publication Data

US 2004/0161899 A1 Aug. 19, 2004

(51) Int. Cl.$^7$ ............................................. H01L 21/336
(52) U.S. Cl. ..................... 438/287; 438/216; 438/785; 438/104
(58) Field of Search ................................ 438/104, 216, 438/287, 770, 771, 785, 786

(56) References Cited

U.S. PATENT DOCUMENTS

| | | | |
|---|---|---|---|
| 5,308,601 | A | 5/1994 | Hampden-Smith et al. |
| 5,972,804 | A | 10/1999 | Tobin et al. |
| 6,350,643 | B1 | 2/2002 | Hintermaier et al. |
| 6,486,080 | B2 * | 11/2002 | Chooi et al. .................. 438/785 |
| 6,500,735 | B2 * | 12/2002 | Usuda .......................... 438/479 |
| 6,544,900 | B2 * | 4/2003 | Raaijmakers et al. ....... 438/769 |

FOREIGN PATENT DOCUMENTS

| | | | | |
|---|---|---|---|---|
| JP | 63236335 | * | 10/1988 | ......... H01L/21/316 |

OTHER PUBLICATIONS

Byeong–Ok Cho et al., "Tuning the Electrical Properties of Zirconium Oxide Thin Films," *Applied Physics Letter*, Feb. 11, 2002, vol. 80, No. 6, pp. 1052–1054.

A. L. P. Rotondaro, et al., "Advanced CMOS Transistors with a Novel HfSiON Gate Dielectric," *2002 Symposium on VLSI Technology Digest of Technical Papers*, Section 15.2.

Yuji Saito, et al., "Advantage of Radical Oxidation for Improving Reliability of Ultra–Thin Gate Oxide," *2002 Symposium on VLSI Technology Digest of Technical Papers*.

M. Togo, et al., "Low–Leakage and Highly–Reliable 1.5 nm SiON Gate–Dielectric Using Radical Oxynitridation for Sub–0.1 $\mu$m CMOS," *2000 Symposium on VLSI Technology Digest of Technical Papers*.

* cited by examiner

*Primary Examiner*—Amir Zarabian
*Assistant Examiner*—Christy Novacek
(74) *Attorney, Agent, or Firm*—Robert L. King; James L. Clingan, Jr.

(57) ABSTRACT

A metal oxide high-k dielectric is deposited on a semiconductor wafer in a manner that reduces dangling bonds in the dielectric without significantly thickening interfacial oxide thickness. A metal oxide precursor and radical oxygen and/or radical nitrogen are co-flowed over the semiconductor wafer to form the high-k dielectric. The radicals bond to dangling bonds of the metal of the metal oxide during the deposition process that is performed at the regular deposition temperature of less than about 400 degrees Celsius. The radical oxygen and radical nitrogen do not require the higher temperatures generally required in an anneal in order to attach to the dangling bonds of the metal. Thus, a high temperature post deposition anneal, which tends to cause interfacial oxide growth, is not required. The dielectric is of higher quality than is typical because the dangling bonds are removed during deposition rather than after the dielectric has been deposited.

21 Claims, 2 Drawing Sheets

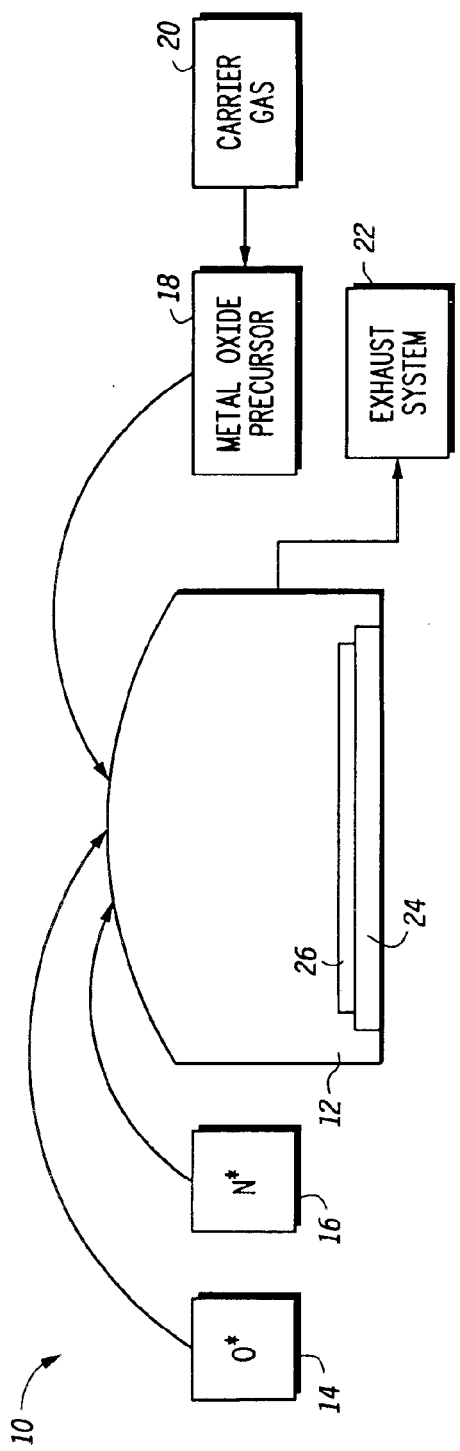
FIG.1
FIG.2
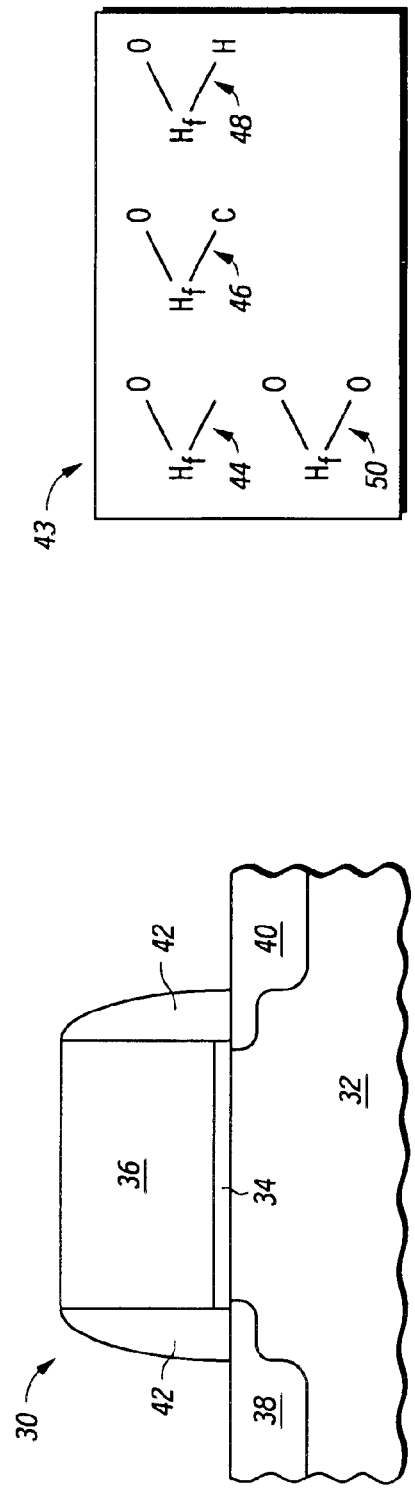
FIG.3

RADICAL OXIDATION AND/OR NITRIDATION DURING METAL OXIDE LAYER DEPOSITION PROCESS

FIELD OF THE INVENTION

This invention relates generally to integrated circuits, and more specifically, to the manufacture of semiconductors having metal oxide layers.

BACKGROUND OF THE INVENTION

In order to increase transistor device speed, conventional SiO2 gate oxides have been scaled aggressively. As $SiO_2$ thickness decreases, the gate leakage current increases significantly due to the direct tunneling as the primary conduction mechanism. One way to decrease the leakage current is to use a gate dielectric with a high dielectric constant, k, so that we can make a physically thick film with the same electrical thickness as $SiO_2$ films. The quality of metal oxide is not as structurally desirable as $SiO_2$ because the high dielectric constant film is fabricated by a deposition method rather than being thermally grown. It is known that the electrical properties of deposition films are inherently inferior to deposition grown films. Therefore, a need exists to improve the quality of high dielectric constant materials.

Typically the film quality is improved by a high temperature post deposition anneal (PDA) step in either an $O_2$ or an $N_2$ ambient. This approach has at least two disadvantages. Firstly, it will increase the interfacial thickness if an $O_2$ PDA is used. Secondly, the efficiency of passivating existing dangling bonds is not effective with this process. In addition, most deposition precursors contain undesirable impurities such as carbon and hydrogen. The carbon and hydrogen will degrade the metal oxide film quality.

CMOS devices suffer from boron penetration for PMOS transistors. It is more problematic for polycrystalline metal oxide structures. One way to minimize boron penetration is to incorporate nitrogen to the film because nitrogen is a known dopant diffusion barrier. Another advantage of nitrogen incorporation is to increase the polycrystalline temperature of high k materials.

BRIEF DESCRIPTION OF THE DRAWINGS

The present invention is illustrated by way of example and not limitation in the accompanying figures, in which like references indicate similar elements.

FIG. 1 illustrates in a perspective form a deposition system using radical oxidation and/or nitridation during formation of a metal oxide layer of a semiconductor in accordance with the present invention;

FIG. 2 illustrates in cross-sectional form of a semiconductor transistor having a metal oxide layer as a gate dielectric;

FIG. 3 illustrates a topographical view of defects associated with a metal oxide layer when deposited using a conventional process.

Figure 4:
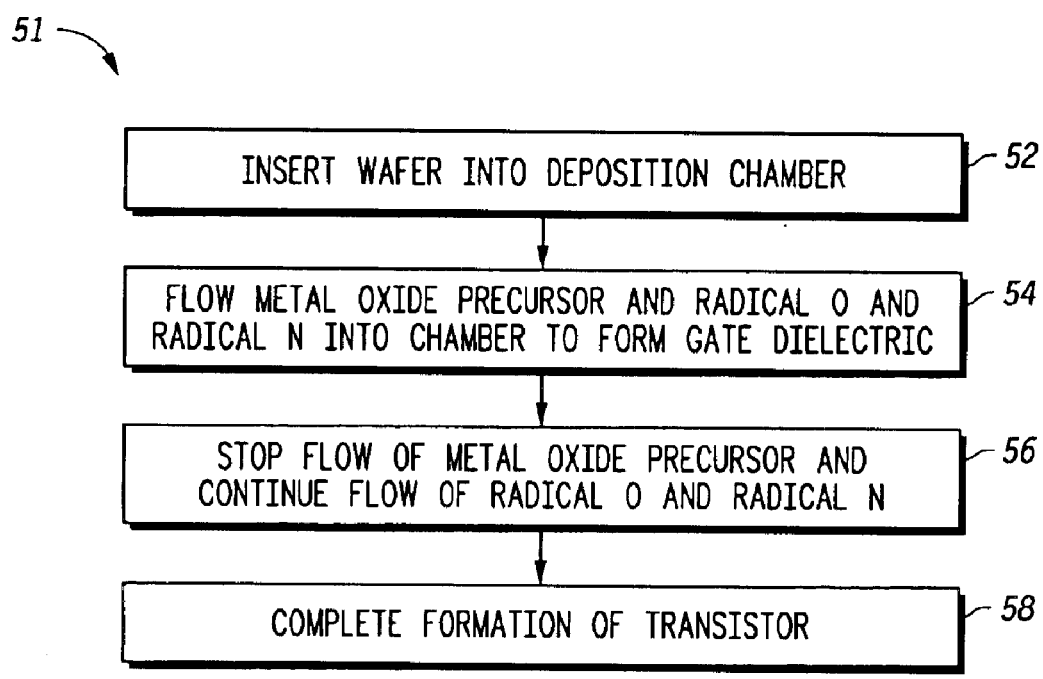
FIG. 4 illustrates in flowchart form a method for forming a metal oxide layer using radical oxidation and/or nitridation in accordance with the present invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Illustrated in FIG. 1 is a deposition system 10 in accordance with the present invention and generally having a deposition chamber 12. A generator 14 for creating radical oxygen gas from an oxygen source (not shown) is coupled to a first inlet of the deposition chamber 12. A generator 16 for creating radical nitrogen gas from a nitrogen source (not shown) is coupled to a second inlet of the deposition chamber 12. A metal oxide precursor container 18 is coupled to a third inlet of the deposition chamber 12. The metal oxide precursor container 18 is connected to a container 20 for storing an inert carrier gas. An outlet of the deposition chamber 12 is coupled to an exhaust system 22. Within the deposition chamber 12 is a chuck 24 for holding a semiconductor wafer 26 containing predetermined integrated circuits. It should be readily understood that the deposition chamber 12 may be implemented to contain multiple wafers at the same time and that in such systems modification to the deposition chamber 12 may be required. In particular, the additional wafers may be supported from the sides of the deposition chamber 12 and the inlet gases may be side-injected rather than injected from a top surface as illustrated in FIG. 1.

In operation, a wafer is moved into the deposition chamber 12 for processing and placed on the chuck 24. The temperature of the deposition chamber 12 is maintained at a low temperature for semiconductor processing. For example, the temperature is in the range of below about 400 degrees Celsius to at least 250 degrees Celsius, if not lower. It should be understood that the temperature may be elevated some from 400 degrees Celsius to implement deposition system 10, but preferably the temperature is not above 400 degrees. The inert carrier gas within container 20 may be one of numerous inert gases that function to transport or carry a metal oxide precursor into the deposition chamber 12. The metal oxide precursor that is within metal oxide precursor container 18 is formed by heating a solid prior to being carried by the inert gas. By way of example only, the inert carrier gas may be one of helium or nitrogen. Other inert carrier gases may be used. Radical oxygen and radical nitrogen are respectively generated in generators 14 and 16. The radical oxygen represents a radical of a first element, and the radical nitrogen represents a radical of a second element. It should be noted that radical oxygen and radical nitrogen are remotely generated or generated outside of the deposition chamber so that the radical gas or gases may be co-flowed into the deposition chamber with the metal oxide precursor gas. Radical oxygen (O*) is atomic oxygen (O) existing in an excited state but not in ionized form. For example, radical oxygen contains sufficient kinetic energy to relocate electrons to an outer shell of the atomic oxygen without removing electrons. In this form, the radical oxygen is in a neutral state and is not electrically charged. Similarly, radical nitrogen (N*) is atomic nitrogen (N) existing in an excited state but not in ionized form. Radical nitrogen also contains sufficient kinetic energy to relocate electrons to an outer shell of the atomic nitrogen without removing electrons. The radical nitrogen is also not electrically charged. The production of radical oxygen and radical nitrogen is conventional and therefore will not be described in detail. It should be appreciated that deposition system 10 may be implemented by using either both of the radical oxygen and radical nitrogen or only one of these gases within the deposition chamber 12. By flowing radicals of oxygen or radicals of both oxygen and nitrogen, the radicals fill dangling bonds of the metal as will be described below. Exhaust system 22 functions to provide a location for storage of exhaust gases from deposition chamber 12 and to permit adjustment of the pressure within the deposition chamber 12. Further explanation of the chemical processing within deposition chamber 12 to deposit a semiconductor layer will be described below.

Illustrated in FIG. 2 is an example of a semiconductor device that may be implemented using the process described herein. An MOS transistor 30 generally has a substrate 32 of predetermined material. Overlying a portion of substrate 32 is a gate dielectric 34 that, in accordance with the description herein, is a metal oxide. Overlying gate dielectric 34 is a control electrode or gate 36. A source 38 and a drain 40 are formed within the substrate 32 and adjacent the gate 36. Overlying a portion of the source 38 and drain 40 is a sidewall 42. The structure of source 38 and drain 40 is typically formed by a conventional process known as an LDD (lightly doped drain) in which two diffusion steps are implemented to obtain the illustrated profile. The description of the deposition chamber 12 above relates to the formation of gate dielectric 34.

Illustrated in FIG. 3 is a topography 43 of a conventionally deposited metal oxide gate dielectric for a transistor. The gate dielectric 34 of FIG. 2 is illustrated by way of example using the metal hafnium, Hf, to form a dielectric of hafnium oxide. Various other metal oxides may be used in lieu of hafnium oxide. For example, aluminum oxide, lanthanum oxide, yttrium oxide, cesium oxide, hafnium aluminum oxide, lanthanum aluminum oxide, yttrium aluminum oxide and cesium aluminum oxide may be suitable materials for this process. In the illustrated form, four different types of resulting bonding structures are illustrated in which three of the four types are not desired. For example, an undesired bonding structure includes a dangling bond 44 in which one of the oxygen atoms is missing resulting in an absent or dangling bond with Hf. Due to impurities, such as carbon and hydrogen, that are inadvertently present in the metal oxide: precursor, there exist undesired bonds such as bonds 46 and 48 between the metal and an impurity. Bond 46 contains a carbon atom rather than an oxygen atom, and bond 48 contains a hydrogen bond rather than a hydrogen bond. In contrast, bond 50 represents a desired bond in which the metal is bonded solely to oxygen.

Illustrated in FIG. 4 is a flowchart illustrating a process 51 for depositing a layer on a semiconductor. In a step 52, a wafer, such as semiconductor wafer 26 of FIG. 1, is inserted into a deposition chamber, such as deposition chamber 12.

In a step 54, a metal oxide precursor is flowed into the deposition chamber 12. As an example, the metal oxide precursor of HTB, hafnium tetra butoxide, is one possible metal oxide precursor. HTB contains both Hf and oxygen sources. Other metal oxide precursors, such as TDEAH, may be used instead. Radical oxygen or radical oxygen and radical nitrogen are concurrently flowed into the deposition chamber 12 to form a gate dielectric layer, such as gate dielectric 34 by a deposition reaction. Different types of deposition processes may be implemented using this chemistry. For example, chemical vapor deposition (CVD), plasma enhanced chemical vapor deposition (PECVD), thermal CVD and atomic layer deposition (ALD) including plasma enhanced atomic layer deposition (PEALD). In step 54 the co-flow of a metal oxide precursor along with either radical oxygen or the combination of radical oxygen and radical nitrogen is performed at a temperature that is much lower than used for conventional metal layer deposition processes. For example, a temperature of about 400 degrees Celsius or less is recommended. Typically, when metal is deposited on a silicon substrate, an intervening undesired silicon dioxide layer is created between a silicon substrate and the newly formed metal layer. The undesired layer results from the conventional use of a high temperature (e.g. 800 degrees Celsius or greater) in order to remove carbon and hydrogen impurities in the depositing layer. However, the high temperature fosters a reaction between a silicon substrate and the inadvertent presence of oxygen in the deposition chamber to create an undesired silicon dioxide layer. In addition to creating undesired electrical properties between the substrate and the metal layer, the silicon dioxide layer adds to the thickness of the structure. By co-flowing radical oxygen at the same time as introducing the metal oxide precursor into the deposition chamber, carbon and hydrogen impurities in the forming dielectric layer being deposited are removed in the form of carbon oxide and water vapor. When both radical oxygen and radical nitrogen are introduced into the deposition chamber at the same time as the metal oxide precursor, the radical nitrogen is incorporated into the newly formed layer in in-situ form.

In a step 56, the flow of the metal oxide precursor is stopped. In step 56, the flow of either radical oxygen or the combination of radical oxygen and radical nitrogen is continued long enough to ensure that the metal oxide layer is adequately oxidized. Additionally, the continued flow of radical nitrogen after the metal oxide precursor is stopped results in the formation of an overlying nitride layer. This nitride layer functions as a barrier during subsequent processing. For example, when the deposited layer is being used as a gate dielectric, an overlying a gate or control electrode is formed. Typical materials used for a gate include polysilicon that is doped to have a predetermined conductivity. The doping is accomplished, in one example, by implanting boron. However, without the nitride layer that is formed over the metal oxide due to the continued flow of the radical oxygen and radical nitrogen, the boron would penetrate into the metal oxide and affect the threshold voltage characteristics of the resulting transistor. Also, the nitride layer formed overlying the metal oxide functions to prevent any interaction between the metal oxide and an overlying polysilicon gate.

In a step 58, the transistor formation is completed by forming source and drain regions for the transistor. Typically source and drain regions are formed in a substrate, but various transistor structures may be implemented using the process described herein. It should be understood that if a combination of radical oxygen and radical nitrogen is not implemented, the process described herein would utilize only radical oxygen in step 54 and either a combination of radical oxygen and radical nitrogen or only radical nitrogen in step 56.

By now it should be appreciated that there has been provided a deposition process for formation of a metal oxide layer using radical oxidation and/or radical nitridation. The metal oxide layer that is deposited in the described process may be used to form various semiconductor structures including a transistor gate insulator or gate oxide. The dimensions of the metal oxide layer are scalable to various dimensions based upon deposition chamber parameters, such as temperature, pressure and time. Variability of transistor threshold voltages can be accurately controlled using this process to obtain a desired low threshold value. The metal oxide layer contains more complete bonds and fewer impurities and therefore is more reliable in terms of composition and operating predictability. By using a low temperature (i.e. around 400 degrees Celsius or less) radical oxidation or combined radical oxidation and radical nitridation during metal oxide deposition, an interfacial oxide thickness between silicon and the metal oxide is minimized significantly. Thickness of the interfacial oxide increases proportionately with temperature. Also, use of radical oxygen during the metal oxide deposition reduces dangling bonds in the formed film. By reducing dangling bonds, the density of the formed film is increased which helps scale down the overall gate stack. The stronger oxidizing ambient of radical oxygen at lower temperatures effectively oxidizes impurities, such as hydrogen and carbon, and achieves high quality of metal oxide by reducing electrical charges in the bulk and interface state density, $D_{it}$, at the interface between the substrate 32 and the lower surface of gate dielectric 34. Additionally, low-temperature nitridation provides better quality of a nitride layer that will exist between an upper surface of gate dielectric 34 and gate 36. The nitridation also improves metal oxide quality of gate dielectric 34 by minimizing boron penetration from the doped polysilicon of gate 36 to the metal oxide of gate dielectric 34. Radical oxygen and radical nitrogen forms a high quality oxide or oxynitride. Transistor gate leakage reduction of metal oxide film due to an improved dielectric film quality is helpful for low-power electronic products. The high quality metal oxide gate dielectric film using the process described herein has a high time dependent dielectric breakdown (TDDB) characteristic and a low stress induced leakage current (SILC) characteristic.

In the foregoing specification, the invention has been described with reference to specific embodiments. However, one of ordinary skill in the art appreciates that various modifications and changes can be made without departing from the scope of the present invention as set forth in the claims below. For example, other layer functions apart from a gate dielectric may be implemented. Any semiconductor structure requiring a metal oxide dielectric may use this process. The type of semiconductor process using this process may also vary such as an MOS process, a bipolar process or a GaAs process. Additionally, step 54 of FIG. 4 can be implemented by flowing only radical nitrogen with the metal oxide precursor to form the gate dielectric because there is a likelihood that some atomic oxygen impurities will be present in the deposition chamber. Accordingly, the specification and figures are to be regarded in an illustrative rather than a restrictive sense, and all such modifications are intended to be included within the scope of the present invention.

The method taught herein may also be useful in the event that a metal oxide deposition is performed by using other techniques (e.g., CVD at >500 C, sputtering) other than co-flowing radical oxidation or/and nitridation at a low temperature. A low-temperature radical oxidation or nitridation as described herein can also be applied at a post deposition anneal to replace a commonly-used anneal at high temperature (i.e. 500 degrees Celsius and greater). In such a process, undesired "defects" can be annealed out at a low temperature without crystallizing the film. If the co-flowing of radical oxygen or/and nitrogen at a low temperature is used as described above during a metal oxide deposition, a post deposition anneal (PDA) might not be needed, or if needed, can be performed by flowing radical oxygen or/and nitrogen at a lower temperature as a post deposition anneal. If other sputtering or CVD deposition techniques are used that require temperatures greater than 500 degrees Celsius, the low temperature (approximately but not limited to 250–400 C) process taught herein may be implemented as a post deposition anneal, instead of using a conventional $N_2/O_2$ anneal at a high temperature (e.g. 800–1000 C).

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of depositing a layer on a semiconductor wafer, comprising:

inserting the semiconductor wafer into a deposition chamber;

flowing a metal oxide precursor as a precursor into the deposition chamber, the metal oxide precursor comprising a compound having both a predetermined metal and oxygen;

while flowing the metal oxide precursor, flowing a radical oxygen gas into the deposition chamber;

heating the metal oxide precursor to form metal oxide bonds over the semiconductor wafer from the predetermined metal and oxygen of the metal oxide precursor; and using the radical oxygen gas in the deposition chamber to eliminate metal bonds containing an impurity by replacing the impurity with oxygen to form desired metal oxide bonds that deposit to form the layer on the semiconductor wafer.

2. The method of claim 1, further comprising stopping the flowing of the metal oxide precursor and continuing the flowing of the radical oxygen gas into the deposition chamber to form the layer.

3. The method of claim 1, wherein the metal oxide precursor is formed by heating a solid and carried by an inert gas.

4. The method of claim 1, wherein the layer is a gate dielectric comprising a metal oxide.

5. The method of claim 4, wherein the gate dielectric further comprises nitrogen.

6. The method of claim 5 wherein the metal oxide is selected from hafnium oxide, aluminum oxide, lanthanum oxide, yttrium oxide, and cesium oxide.

7. The method of claim 6, wherein the metal oxide further comprises silicon.

8. The method of claim 5, wherein the metal oxide is selected from hafnium aluminum oxide, lanthanum aluminum oxide, yttrium aluminum oxide, and cesium aluminum oxide.

9. The method of claim 5, wherein the metal oxide is hafnium oxide.

10. The method of claim 9, wherein the metal oxide precursor comprises heated hafnium tetra-butoxide (HTB) in an inert carrier gas.

11. A method of forming a transistor, comprising:

providing a semiconductor wafer;

inserting the semiconductors wafer into a deposition chamber;

forming a dielectric layer;

completing forming the transistor using the dielectric layer as a gate dielectric;

wherein the forming the dielectric layer comprises:

flowing a metal oxide precursor into the deposition chamber, the metal oxide precursor comprising a compound having both oxygen and a metal, the metal oxide precursor forming metal oxide bonds from components of the compound over the semiconductor wafer in response to heat, some of the metal oxide bonds being dangling bonds;

while flowing the metal oxide precursor, flowing radicals of at least one of oxygen and nitrogen capable of filling dangling bonds of the metal and replacing impurities of the metal oxide bonds with the first element and at a temperature below about 400 degrees Celsius; and stop flowing the metal oxide precursor and flowing only nitrogen radicals.

12. The method of claim 11, wherein the metal oxide precursor is either hafnium tetra butoxide (HTB) or TDEAH.

13. The method of claim 11, wherein the radicals are oxygen radicals.

14. The method of claim 11, wherein the radicals are only nitrogen radicals.

15. The method of claim 11, wherein the impurities comprise at least one of hydrogen and carbon.

16. The method of claim 15, wherein the dielectric layer is a substantially planar layer of substantially uniform thickness.

17. The method of claim 11, wherein the dielectric layer is a metal oxide selected from hafnium oxide, aluminum oxide, lanthanum oxide, yttrium oxide, and cesium oxide.

18. The method of claim 17, wherein the dielectric layer further comprises nitrogen.

19. A method of depositing a dielectric layer on a semiconductor wafer, comprising:

inserting the semiconductor wafer into a deposition chamber;

flowing a metal oxide precursor into the deposition chamber, the metal oxide precursor comprising a compound having both a predetermined metal and oxygen, the metal oxide precursor forming metal oxide bonds from components of the metal oxide precursor over the semiconductor wafer in response to being heated, some of the metal oxide bonds containing impurities and some of the metal oxide bonds being dangling bonds; and while flowing the metal oxide precursor, flowing both a radical oxygen gas and a radical nitrogen gas into the deposition chamber to form the dielectric layer, the radical oxygen gas replacing the impurities and filling the dangling bonds with oxygen atoms, wherein the deposition chamber is heated to a temperature below about 400 degrees Celsius during the flowing.

20. The method of claim 19, wherein the dielectric layer is a metal oxide further comprising at least one of aluminum, silicon, and nitrogen.

21. The method of claim 19, wherein the flowing further comprises providing the at least one of the radical oxygen gas and the radical nitrogen gas to the deposition chamber from a location external to the deposition chamber.

* * * * *

UNITED STATES PATENT AND TRADEMARK OFFICE
CERTIFICATE OF CORRECTION

PATENT NO. : 6,884,685 B2 Page 1 of 1
APPLICATION NO. : 10/366777
DATED : February 14, 2003
INVENTOR(S) : Tien Ying Luo It is certified that error appears in the above-identified patent and that said Letters Patent is hereby corrected as shown below:

In Column 6, Line 61, Claim No. 11:
    Change "inserting the semiconductors" to --inserting the semiconductor--

Signed and Sealed this

Thirteenth Day of May, 2008

JON W. DUDAS
*Director of the United States Patent and Trademark Office*

UNITED STATES PATENT AND TRADEMARK OFFICE
CERTIFICATE OF CORRECTION

PATENT NO. : 6,884,685 B2  Page 1 of 1
APPLICATION NO. : 10/366777
DATED : April 26, 2005
INVENTOR(S) : Tien Ying Luo It is certified that error appears in the above-identified patent and that said Letters Patent is hereby corrected as shown below:

In Column 6, Line 61, Claim No. 11:
    Change "inserting the semiconductors" to --inserting the semiconductor--

This certificate supersedes the Certificate of Correction issued May 13, 2008.

Signed and Sealed this

Third Day of June, 2008

JON W. DUDAS
*Director of the United States Patent and Trademark Office*